United States Patent [19]

Kubota

[11] Patent Number: 5,702,224
[45] Date of Patent: Dec. 30, 1997

[54] GRAVITATIONAL IC PACKAGE TRANSFER MECHANISM

[75] Inventor: Toshihiro Kubota, Honjo, Japan

[73] Assignee: Hitachi Electronics Engineering Co., Ltd., Tokyo, Japan

[21] Appl. No.: 699,341

[22] Filed: Aug. 19, 1996

[30] Foreign Application Priority Data

Dec. 22, 1995 [JP] Japan ..................... 7-349566

[51] Int. Cl.⁶ ............................................ B65B 69/00
[52] U.S. Cl. .................. 414/403; 414/416; 414/627; 414/225; 414/754; 53/475; 221/211; 221/233; 29/809
[58] Field of Search ....................... 414/403, 414, 414/415, 416, 419, 421, 425, 754, 798.9, 798.2, 618, 626, 627, 222, 225, 226; 53/473, 475, 284.5, 247, 255; 221/211, 233; 29/428, 741, 759, 809

[56] References Cited

U.S. PATENT DOCUMENTS

| | | | |
|---|---|---|---|
| 4,194,865 | 3/1980 | Bandoh | 414/403 |
| 4,660,282 | 4/1987 | Pfaff | 414/416 X |
| 4,760,924 | 8/1988 | Sato et al. | 414/403 X |
| 4,761,106 | 8/1988 | Brown et al. | 414/403 X |
| 4,878,801 | 11/1989 | Pearson | 414/416 X |
| 5,261,775 | 11/1993 | Kobayashi | 414/403 |
| 5,284,413 | 2/1994 | Wilkinson et al. | 414/416 |
| 5,328,317 | 7/1994 | Masui et al. | 414/403 |

FOREIGN PATENT DOCUMENTS

| | | | |
|---|---|---|---|
| 62-248 | 3/1988 | Japan | 414/403 |
| 2235581 | 3/1981 | United Kingdom | 414/403 |

*Primary Examiner*—Frank E. Werner
*Attorney, Agent, or Firm*—Oblon, Spivak, McClelland, Maier & Neustadt, P.C.

[57] ABSTRACT

An IC package transfer mechanism for transferring molded IC packages to and from a flat tray with a large number of IC holder nests in an array and an IC magazine adapted to accommodate a large number of IC packages in a row within a tubular housing to be turned into a tilted position in loading and unloading operations to let IC packages slide into or out of the cylindrical housing automatically by gravity. The IC package transfer mechanism comprises: an IC transfer block movably supported for displacement between a horizontal position and a tilted position, and internally provided with a slide channel with stopper devices for holding a plural number of IC packages in predetermined IC stop positions, the slide channel having an open entrance at an end to be turned into the tilted position and connected to an outlet end of a tubular IC magazine set in a similarly tilted position for transferring IC packages to the slide channel automatically by gravitational sliding movements of individual IC packages, along with top openings bored over in a top wall over the IC stop positions to permit access to IC packages in the slide channel by a handling device.

7 Claims, 13 Drawing Sheets

GRAVITATIONAL IC PACKAGE TRANSFER MECHANISM

BACKGROUND OF THE INVENTION

1. Field of the Art

This invention relates to an IC (integrated circuit) package transfer mechanism and more particularly to a gravitational transfer mechanism suitable for use in transferring and relocating molded IC device packages between a flat IC holder tray with an array of IC holder nests and an IC magazine or magazines which are adapted to hold a large number of IC packages in a row within a tubular housing.

2. Prior Art

Generally, molded IC device packages (hereinafter simply referred to as "IC devices" or "IC packages" for brevity) coming out of a fabrication process are inspected before shipment for quality control purposes, for example, to check for bends in lead pins or to test electrical characteristics or properties. IC devices are usually handled by the use of jigs when transferring them to and from an inspection or testing machine or to a shipment station. Typical of jigs which accommodate IC device packages are IC magazines and IC holder trays. IC magazines normally have a hollow tubular housing which is adapted to accommodate a large number of IC packages in a row, while IC holder trays are formed in a flat box- or plate-like shape with a large number of recessed IC holder nests regularly arranged in an array of rows and columns.

Molded IC device packages can be classified into a pin insertion type and a flat mount type by the shape of lead pins to be mounted on a circuit board. In the case of the pin insertion type, the lead pins which are led out on the opposite lateral sides of a molded IC package casing are bent downward for insertion into through holes which are bored in a circuit board. In contrast, in the case of the flat mount type, the lead pins on the opposite lateral sides of a molded package casing are bent substantially in Z-shape in middle portions to provide flat outer end portions which can be placed flatly in contact with electrodes on a circuit board and electrically connected to the latter by soldering or the like.

The pin insertion type IC packages can be relatively easily loaded in a row within a tubular magazine by placing lead pins of the respective IC packages astride of a raised slide surface which is provided within the magazine for sliding contact with lower sides of the molded IC package casings. In addition, by tilting the magazine at the time of loading and unloading operations, individual IC packages can be urged to slide into and out of the magazine automatically by gravity along the slide surface with the lead pins guided by wall surfaces at the opposite sides of the raised slide surface, allowing loading and unloading operations to proceed in an extremely smooth and secure manner.

Conversely, the flat mount type IC packages with the above-described flatly folded pin construction are often found difficult to put in gravitational sliding movement in loading and unloading operations because of infeasibility of guiding lead pins stably along predetermined guide surfaces. Especially in case of IC devices of the so-called QFP (Quad Flat Package) type which have lead pins on all four sides of a package casing, difficulties are often encountered in discharging them out of a magazine as lead pins of adjacent IC packages tend to entangle with each other. However, loading and unloading by gravitational sliding movements could be possible with flat mount type IC devices which have lead pins only on the opposite lateral sides of a molded package casing like SOP (Small Outline Package) type IC devices, provided the IC magazine are so shaped as to ensure smooth movements of IC packages.

Of the above-mentioned two types of jigs for holding IC device packages, tubular magazines are more advantageous than flat trays from the standpoint of compactness in shape and space factor in storage and transportation. For these reasons, even for SOP type IC devices, it is desirable to use magazines as a jig for transfer, relocation or transportation purposes. At the time of making measurements for testing electrical properties or characteristics for quality control, however, the flat mount type IC devices including SOP type packages need to be transferred to an IC tester and lifted to a predetermined testing position on a flat tester tray which is provided with a large number of nests for IC device holder nests in an array in relation with testing positions of individual IC devices on the IC tester, for the sake of stability of electrical connections and efficiency of the testing operation. Accordingly, there routinely arise necessities for transferring or relocating IC devices onto a flat tray from an elongated tubular magazine or vice versa. However, in the absence of an IC package transfer mechanism which is capable of automatically transferring and relocating IC devices between a tubular magazine and a flat tray, it has been the conventional practice to handle IC devices manually one by one when transferring them to a different type jig despite extremely poor working efficiency.

SUMMARY OF THE INVENTION

In view of the foregoing situations, it is an object of the present invention to provide an IC package transfer mechanism which is capable of transferring molded IC device packages or the like between a tubular IC device magazine and a flat tray automatically in a smooth and efficient manner automatically by gravitational sliding movements of individual IC packages.

In accordance with the present invention, the above-stated objective is achieved by the provision of an IC package transfer mechanism for transferring molded IC device packages or the like to and from a flat tray with a large number of IC holder nests in an array on the upper side thereof and an IC magazine adapted to accommodate a large number of IC packages in a row within a tubular housing to be turned into a tilted position in loading and unloading operations to let IC packages slide into or out of the cylindrical housing automatically by gravity, the IC transfer mechanism comprising: an IC package transfer block movably supported for displacement between a horizontal position and a tilted position, and internally provided with a slide channel with stopper means for holding one or a plural number of IC packages in predetermined IC stop positions, the slide channel having an open entrance at an end to be turned into the tilted position and connected to an outlet end of a tubular IC magazine set in a similarly tilted position at a loading terminal for transferring IC packages onto the slide channel automatically by gravitational sliding movements of individual IC packages, along with top openings bored in a top wall over the IC stop positions to permit access to IC devices in the slide channel from above by a handling means when the transfer block is in the horizontal position.

In a preferred form of the invention, the IC transfer block is pivotally connected at one end to a reciprocating slide member and thereby displaced between a horizontal position and a tilted position through a cam member connected to the other end of the IC transfer block for tilting same in relation with back and forth movements of the slide member.

Preferably, the slide channel of the IC transfer block is adapted to hold a plural number of IC packages in a plural number of IC stop positions along the length thereof, and provided with stopper members at the respective stop positions, the stopper members being retractably protruded into blocking positions in the slide channel except for a fixed stopper member provided in a deepest stop position remote from the entrance end. The top openings are bored over the respective IC stop positions of the slide channel and arranged in same positional relations as the IC holder nests on the tray.

Further, preferably the above-mentioned slide channel of the IC transfer block is provided with retractable clamper members at the respective IC stop positions for securely gripping IC packages in the IC stop positions in cooperation with said stopper members.

According to the invention, a singular IC package separator is located transversely movably between the outlet end of the IC magazine and the IC transfer block for singling out and feeding an IC package from the magazine to the slide channel of the IC transfer block. Preferably, the singular IC package separator is constituted by a shuttle block arranged to be moved back and forth transversely of the outlet end of the magazine and internally provided with an IC passage so dimensioned as to receive and accommodate only a single IC package at one time.

BRIEF DESCRIPTION OF THE DRAWINGS

The above and other objects, features and advantages of the invention will become apparent from the following particular description, taken in conjunction with the accompanying drawing which show by way of example preferred embodiments of the invention and in which.

PARTICULAR DESCRIPTION OF THE INVENTION

Hereafter, the present invention is described more particularly by way of a preferred embodiment in which an IC package transfer mechanism according to the invention is applied for transferring SOP type IC packages from tubular magazines onto a flat tray in a loading section of an IC tester machine to which packaged IC devices are fed successively to undergo an electrical characteristics test. However, it is to be understood that the IC package transfer mechanism according to the present invention is not restricted to particular examples shown and can be applied for other purposes involving other types of IC devices.

Figure 1:
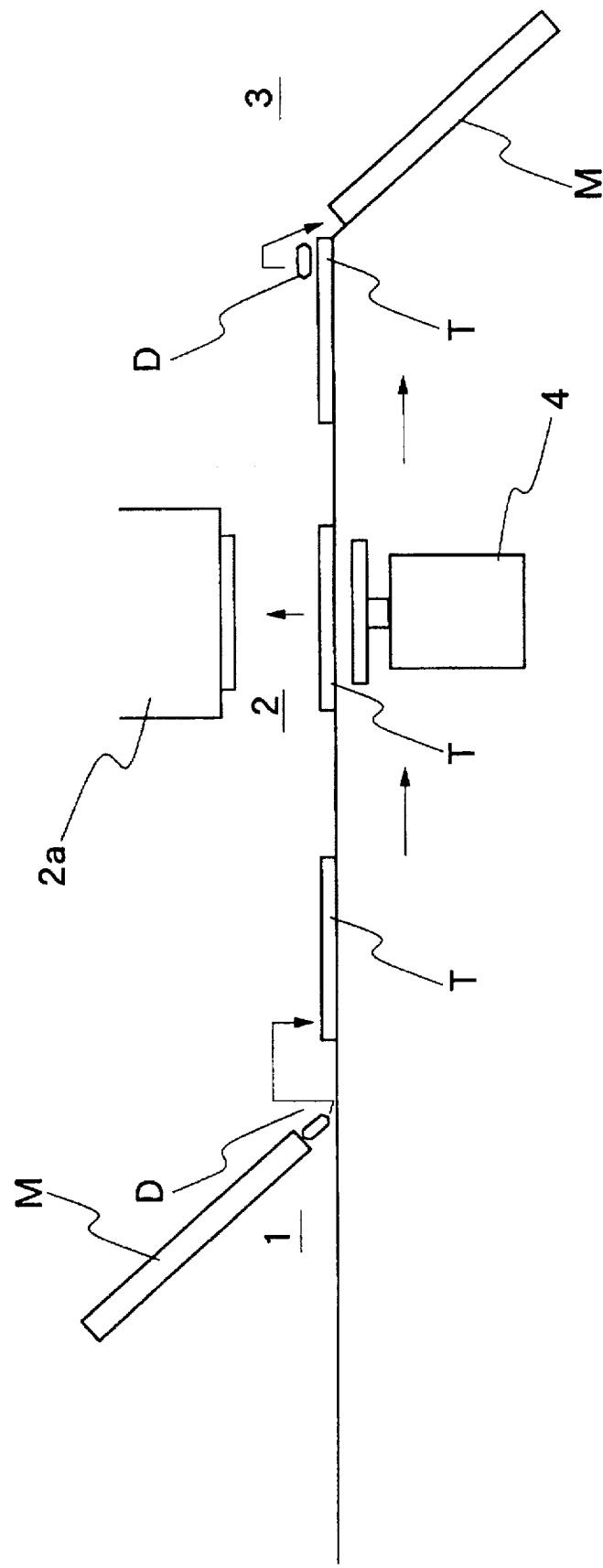
FIG. 1 a schematic illustration of the general layout of a typical IC tester machine for measuring electrical properties of molded IC packages.
Figure 2:
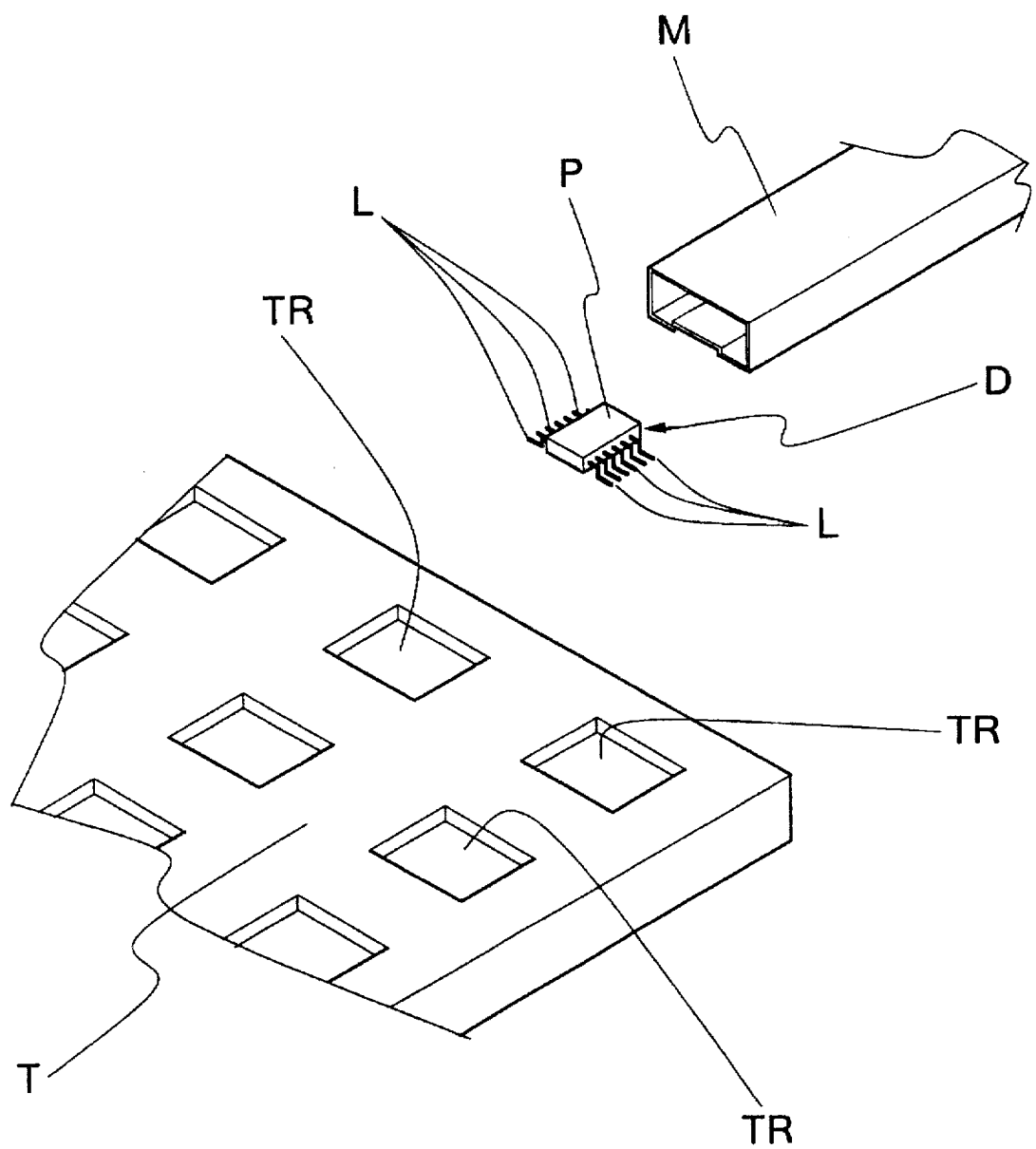
FIG. 2 is a schematic outer view of a molded IC package to be transferred from a tubular IC magazine to a flat tray.

In FIG. 1, indicated at 1 is a loading section, at 2 is a testing section and at 3 is an unloading section of an IC tester machine. Tubular IC magazines M are located in the loading and unloading sections 1 and 3, while flat tester trays T are located in the testing section of the machine. Denoted at D are SOP type IC packages each one of which has a large number of lead pins L led out on the opposite lateral sides of a molded package casing as shown in FIG. 2. The lead pins L are bent in Z-shape in middle portions in such a way that outer end portions of the respective lead pins are turned flatly in lateral directions at a level lower than the bottom surface of the package casing P. It is these outer end portions that are flatly mounted on a circuit board by soldering.

The IC magazines M and trays T are used as jigs for holding the IC devices D. More specifically, the magazines M are each arranged to hold a large number of IC devices D in a row within a lengthy tubular housing. For loading or unloading IC devices into or out of the magazine M, one end of the tubular housing is opened while holding a plug member at the other end of the magazine in closed state. In a loading or unloading operation, the lower sides of molded package casings P of the respective IC devices D are caused to slide along a bottom wall portion of the magazine M which is raised in the fashion of a rail. The magazine M is dimensioned to have an inside width, i.e., the spacing between its opposite lateral side walls, which is slightly larger than the width of each IC package between the outer ends of the lead pins L on the opposite lateral sides of the molded package casing P, so that, when the magazine M is tilted, the IC devices D can be urged to slide toward a lowered end the magazine M by gravity longitudinally on and along the raised bottom wall without undergoing any disturbances in posture. On the other hand, the tester tray T has a flat plate-like body of metal or synthetic resin material, which is provided with a large number of recessed IC holder nests TR arranged in an array of rows and columns on its upper side. The IC holder nests TR are open on the upper side, so that IC devices d can be put on or off the tray T by the use of a suction gripper means or the like which is movable toward and away from the tray T to suck on or off the molded package casings P of IC devices D. The tray T is usually provided with positioning and clamp mechanisms for holding IC devices securely in position within the respective holder nests TR although these mechanisms are omitted in the drawings for the sake of simplicity of illustration.

Figure 3:
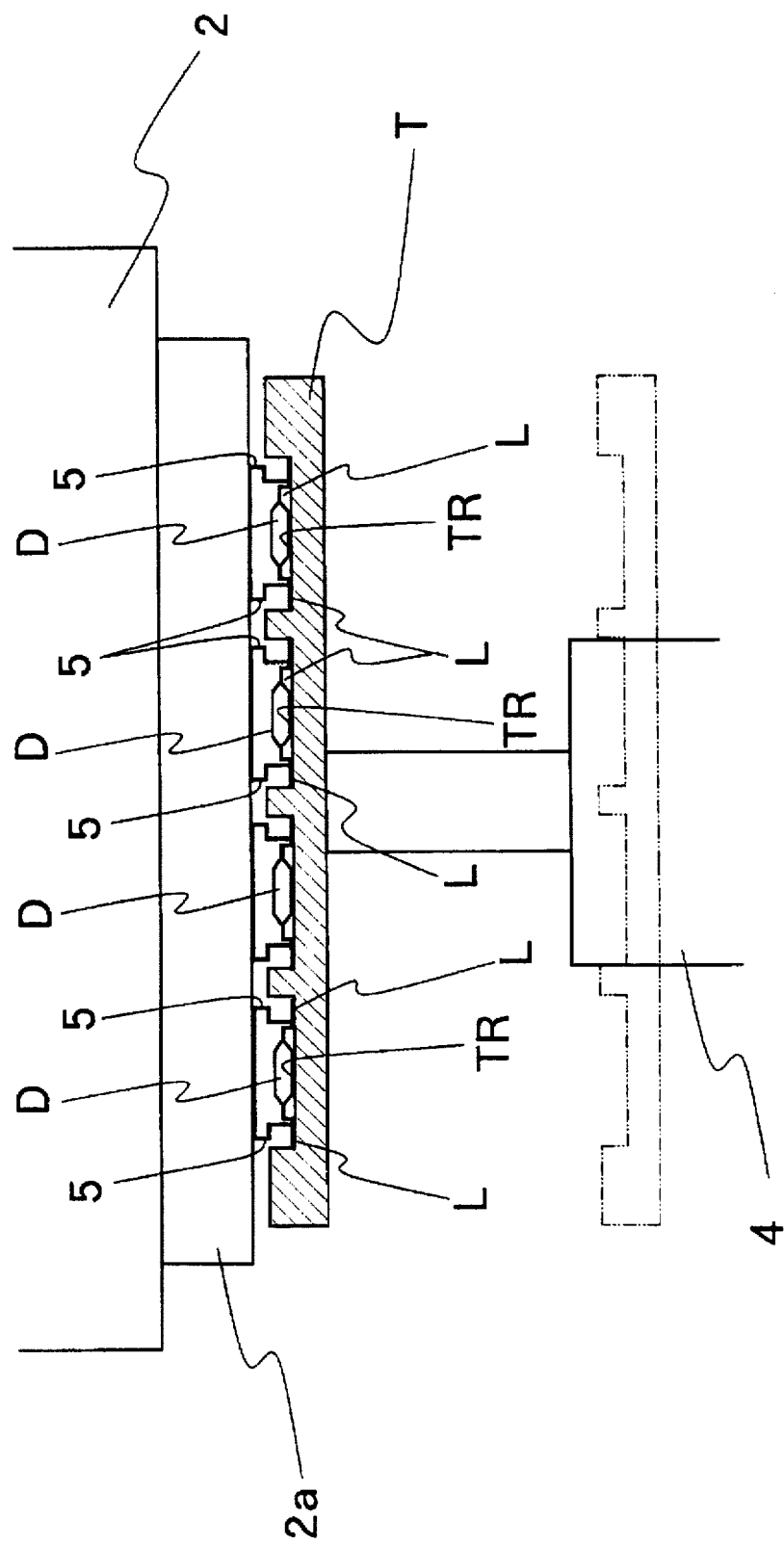
FIG. 3 is a schematic illustration of a loaded tester tray lifted into a testing position against an IC tester head by a tray lifter.

As soon as a tray T is loaded with IC devices D in the respective IC holder nests TR, it is transferred along a predetermined IC transfer path toward an IC tester head 2a which is located over the IC transfer path in the testing section 2 as shown in FIG. 3. Upon reaching a position beneath the tester head 2a, the tray T is lifted up by a tray lifting mechanism 4 in the form of a piston-cylinder or the like to bring the lead pins of IC devices D in the respective IC holder nests TR into abutting engagement with a large number of contact pins 5 on the lower side of the tester head 2a to test electrical characteristics of the IC devices D in the manner well known in the art.

By using a tray T for the transfer of IC devices D as described above, it becomes possible to transfer a large number of IC devices D simultaneously without jamming troubles into and out of contact with the tester head 2a through simple upward and downward movements, permitting to carry out product tests efficiently at an increased speed even in the case of SOP type IC devices D which are generally considered unsuitable for transfer by gravitational sliding movement. On the other hand, in terms of convenience, compactness and easy handling in storage and transportation, magazines M are superior to flat open trays T. Therefore, desirably IC devices D in a magazine M are relocated on a flat tester tray T at the loading section 1 of the tester machine, and, after a characteristics test at the testing section 2, relocated again into a magazine at the unloading section 3. Namely, IC devices D are transferred on a flat tester tray T through the testing section 2.

For discharging IC devices D from a magazine M at the loading section 1 of the IC tester machine, the magazine M is set in a tilted position thereby urging the IC devices to slide out of the magazine M automatically by gravity. Similarly, at the unloading section 3, IC devices D are urged to slide into a tilted magazine M automatically by gravity.

Figure 4:
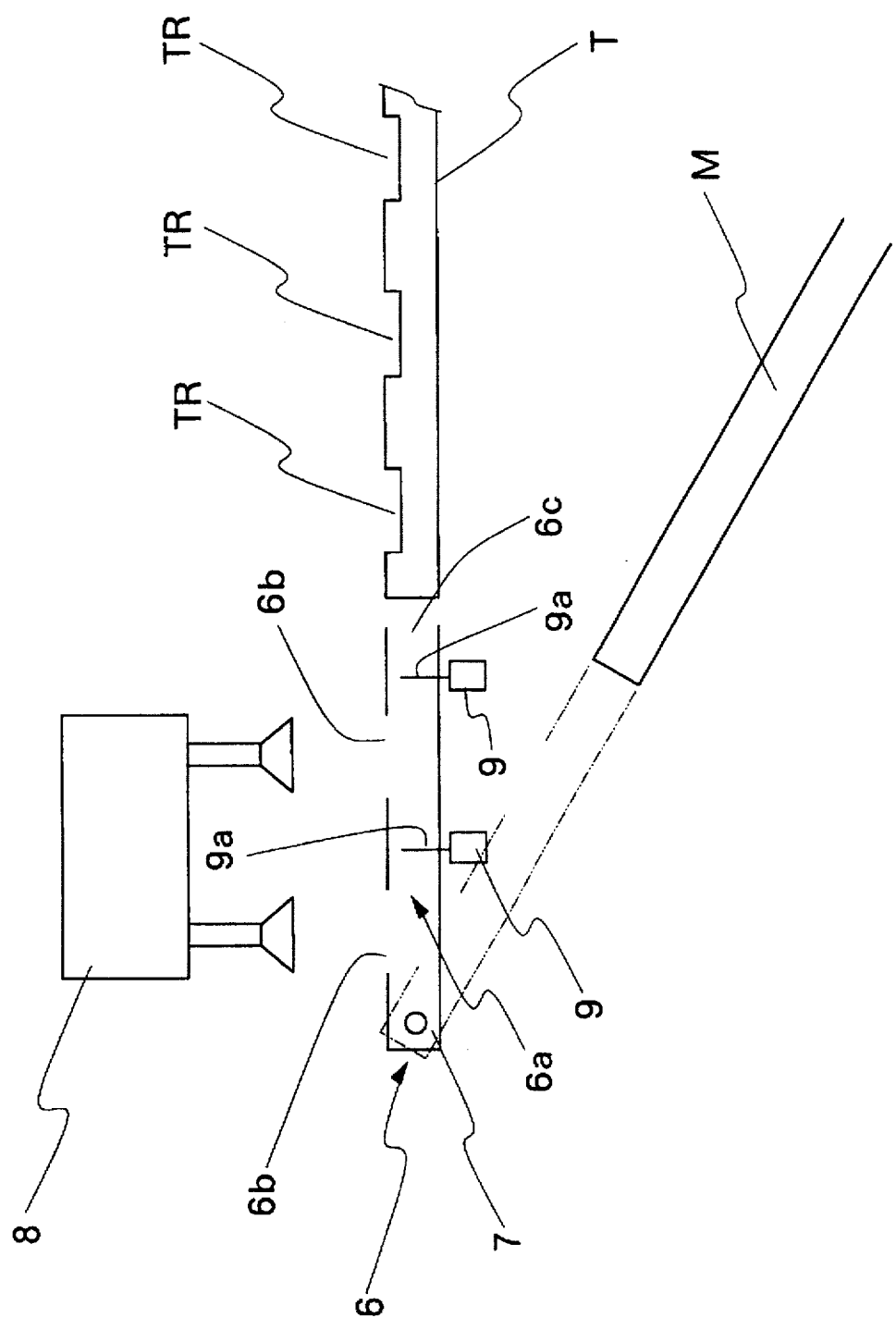
FIG. 4 is a schematic view of an IC package transfer mechanism in an unloader section of the tester machine.

At the unloading section 3, IC devices D are transferred from a tray T, which is retained in a horizontal position, into a magazine M which is tilted downward in a direction away from the tray T, for example, by the use of an unloading transfer block which is arranged as shown in FIG. 4.

More specifically, indicated at 6 is an unloader transfer block which is arranged to accommodate a couple of IC devices within an internal slide channel 6a, which is accessible from above through a couple of openings 6b bored in a top wall of the slide channel 6a. The unloading transfer block 6 is pivotally supported at one end on a pivoting shaft 7 and moved by a drive means, which is not shown, to shift its position to and from a horizontal position level with a flat tray T and a tilted position in conformity with a predetermined angle of inclination of the magazine M in a tilted state. At the end away from the pivoting pin 7, the unloading transfer block 6 is provided with an IC package exit opening 6c to discharge IC devices in the slide channel 6a therethrough. In order to hold IC devices D in predetermined positions within the slide channel 6a of the unloading transfer block 6, a pair of stopper means 9 in the form of piston-cylinders or the like are mounted on the lower side of the unloading transfer block 6, with piston rods 9a of the respective cylinders retractably projected into the slide channel 6a through a bottom wall of the unloading transfer block 6.

While the unloading transfer block 6 is held in a horizontal position as indicated by a solid line in FIG. 4, a couple of IC devices D are picked up from IC holder nests TR on a tray T by a suction or vacuum gripper means 8 and placed in the slide channel 6a of the unloading transfer block 6 by lowering suction heads of the gripper means 8 into the slide channel 6a through the openings 6b. After releasing the IC devices D in predetermined positions within the slide channel 6a, the suction gripper means 8 is moved away from the unloading transfer block 6.

Nextly, as indicated by an imaginary line in FIG. 4, the unloading transfer block 6 is turned into a tilted position with the exit end 6c of the slide channel connected to an inlet end of a magazine M. At this point, the IC devices D in the slide channel 6b are still held in a stationary state by the stopper rods 9a which are protruded into the slide channel 6a. Then, one stopper rod 9a which is closer to the exit end 6c is firstly retracted beneath the bottom wall of the slide channel 6a, whereupon one IC device D is released and allowed to slide into the magazine M. Thereafter, the other stopper rod 9a is retracted to let the other IC device D slide into the magazine M.

As described above, at the unloading section 3, IC devices D are transferred to and relocated in a tilted magazine M easily and securely by gravitational sliding movements of the IC devices themselves by the use of the unloading transfer block 6 which can be turned into a tilted position continuously to the inlet end of the magazine M.

However, at the loading section 1 of the tester machine, in order to transfer IC devices D in a tilted magazine M into IC holder nests TR on a horizontal flat tray T, it is necessary to orient the postures of IC devices D once into a horizontal state prior to transferring them onto the flat tray T, for example, by the use of an IC loading transfer block as described below.

Figure 5:
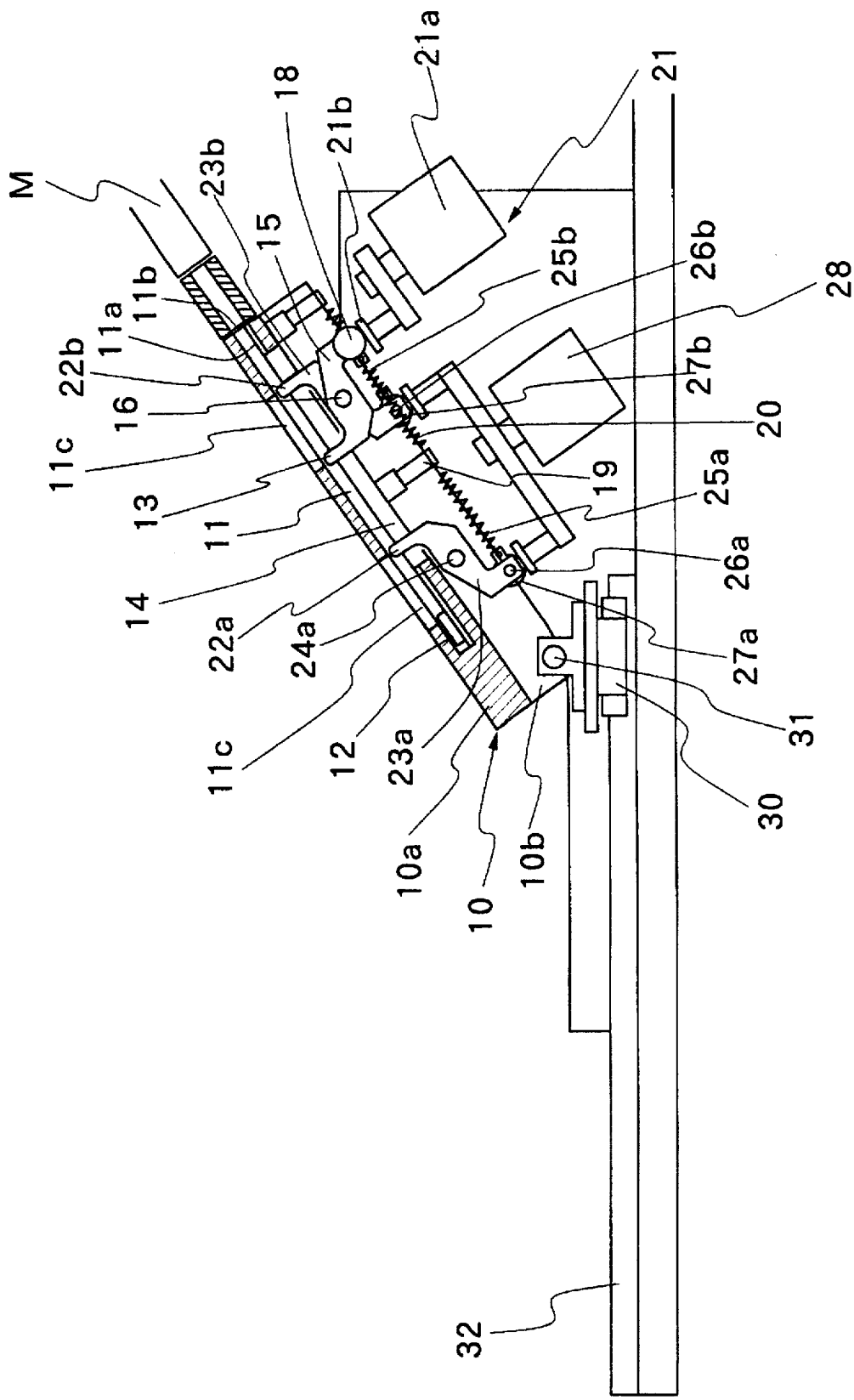
FIG. 5 is a schematic sectional view of an IC package transfer mechanism in a loader section of the tester machine.
Figure 6:
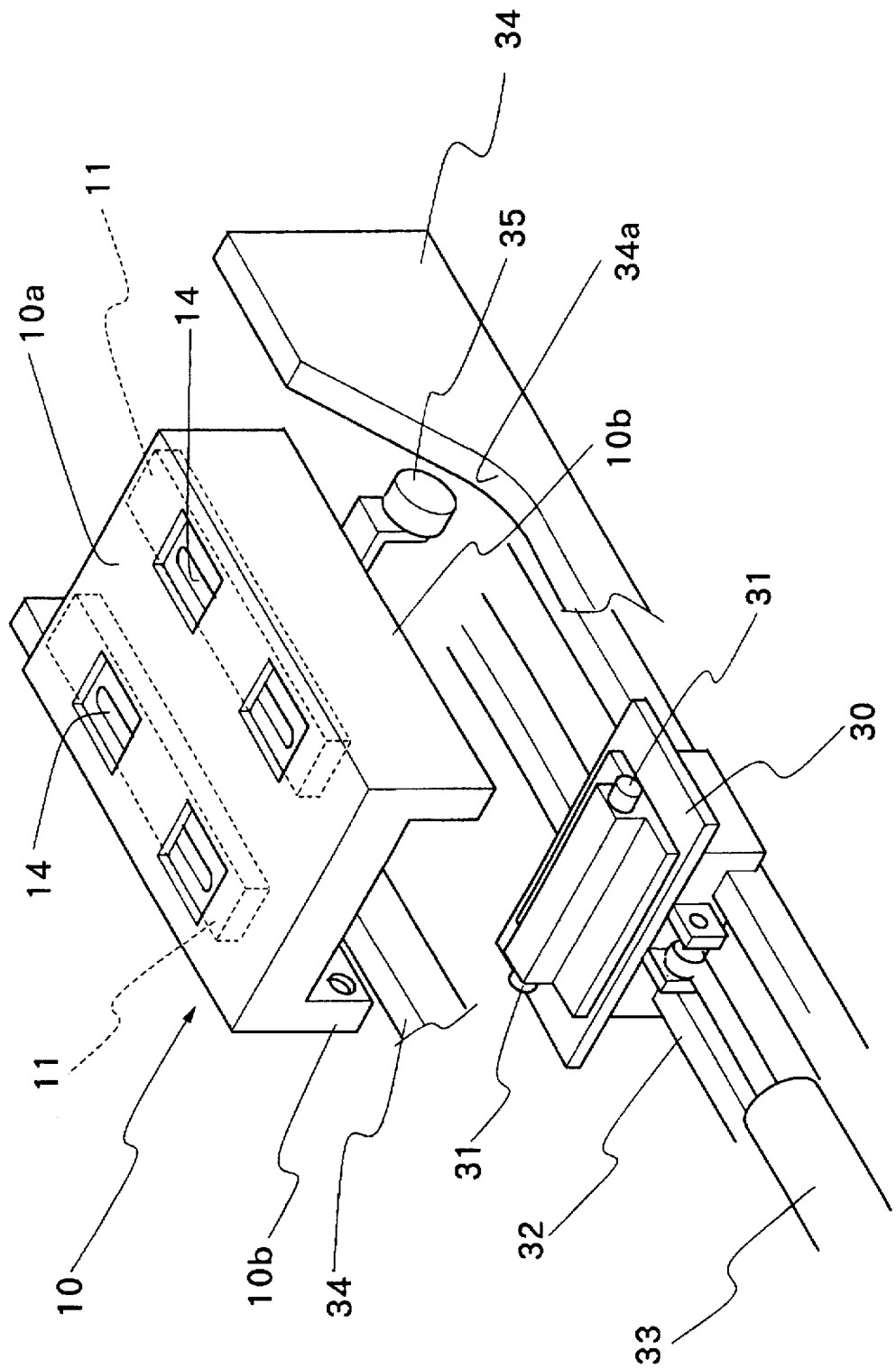
FIG. 6 is an exploded view of an IC transfer block and a transfer block shifting mechanism.

Shown in FIGS. 5 and 6 is a loading transfer block 10 which is located in the loading section 1 of the tester machine. The loading transfer block 10 is largely constituted by a main body 10a substantially in the form of a rectangular block, and a couple of mount portions 10b which are extended downward from the opposite lateral sides of the main body 10a. For the sake of efficient transfer and relocation of IC devices D, the loading transfer block 10 is internally provided with a pair of longitudinal slide channels 11 side by side in parallel relation with each other. These slide channels 11 are formed in a width which is slightly wider than the overall width of the molded package of IC device D, that is to say, the overall width between the outer ends of lead pins L on the opposite sides of a molded IC package casing, and in a depth which is larger than the height of the IC package from the lower mounting surfaces of lead pins L to the top surface of the molded package casing P. IC device packages D are slidable into and along the slide channels 11 with the top surfaces of the respective molded package casings P in contact with slide surfaces 11a at the bottom of the slide channels 11. Each slide channel 11 is open at one end to provide an entrance opening 11b for IC devices D, and adapted to receive a couple of IC devices D in two longitudinally spaced positions (IC devices in the fore and rear positions are designated by different reference characters "Da" and "Db" in the following description whenever necessary).

Each slide channel 11 is provided with stopper members 12 and 13 in two spaced positions for stopping IC devices Da and Db in predetermined fore and rear positions. The first stopper member 12 is fixed in a predetermined position of the slide channel 11, while the second stopper member 13 is protruded into the slide channel 11 from beneath through a slit-like groove 14 and capable of shifting its position between a blocking position for restraining movements of an IC device D and a receded or retracted position for permitting movements of an IC device D. In this instance, the stopper member 13 in each slide channel 11 is shifted to and from the blocking and receded positions concurrently with the stopper member 13 in the other slide channel 11.

Figure 7:
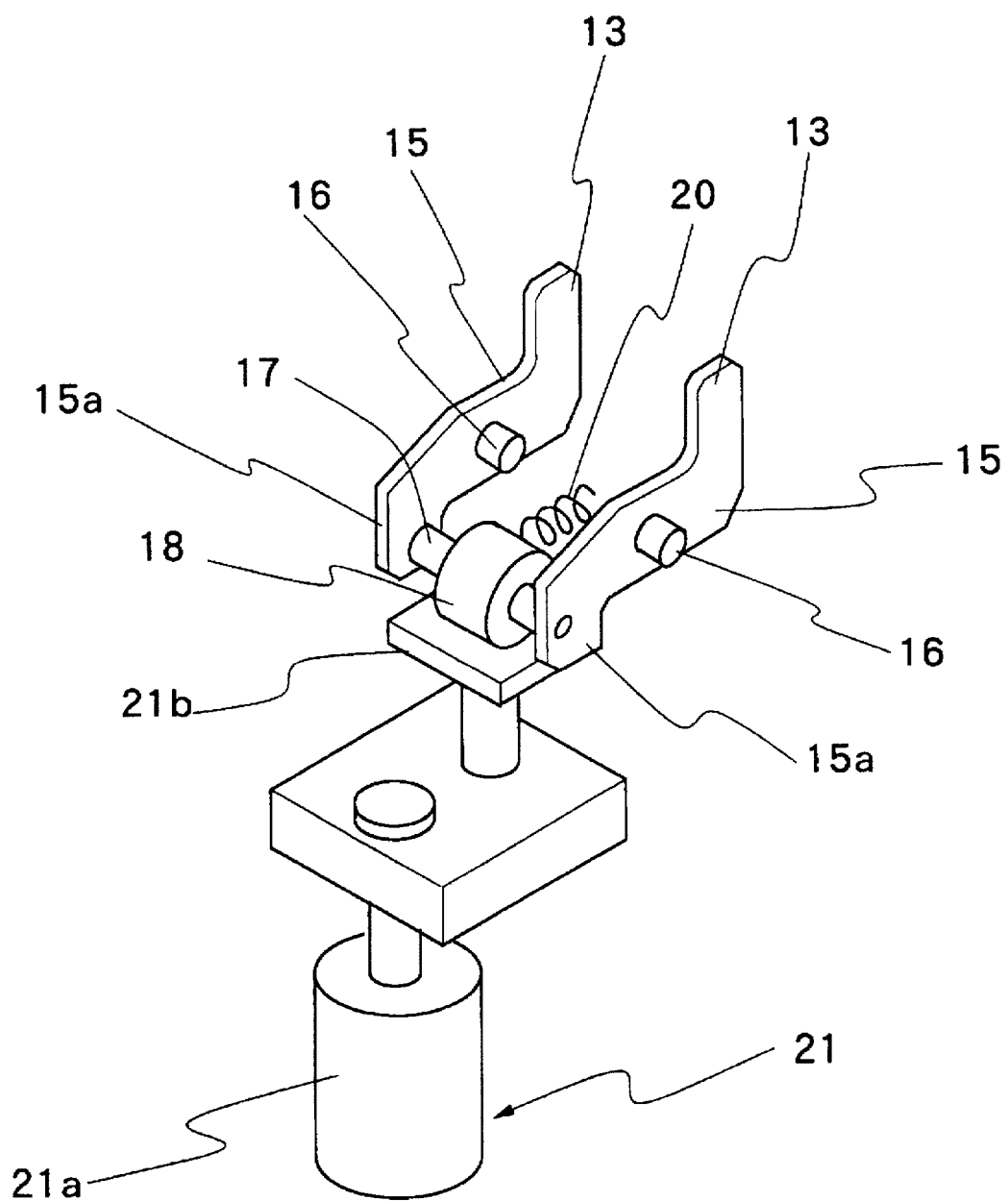
FIG. 7 is a schematic illustration showing the construction of a retractable stopper member.

For this purpose, as shown particularly in FIG. 7, each one of the stopper members 13 of the two slide channels 11 is provided on one end of a lever 15 which is extended along the lower side of the main body 10a of the loading transfer block 10 and vertically rockably supported in its middle portion on the mount portion 10b of the transfer block 10 through a shaft 16. The lever 15 is provided with a lower extension 15a at the other end away from the stopper 13, the lower extension 15a being connected to a similar lower extension 15a of the other lever 15 through a connecting shaft 17 which is bridged between the two levers 15. The just-mentioned connecting shaft 17 is provided with a roller 18. A spring 20 is tensioned between the connecting shaft 17 and a spring retainer 19 which is suspended on the lower side of the main body 10a of the loading transfer block 10, thereby urging both of the stopper members 13 into the protruded blocking positions in the slide channels 11.

In order to shift the stopper members 13 into receded positions against the biasing force of the spring 20, the loading transfer block 10 is provided with a pusher means 21 which is operative in relation with a tilted position of the loading transfer block 10 as will be described hereinlater. The pusher means 21 is constituted by a drive member 21a such as a solenoid, piston-cylinder or the like, and a pusher plate 21b to be moved up and down by the drive member 21a. As the loading transfer block 10 is turned into a tilted position, the above-mentioned roller 18 is abutted against the pusher plate 21b or positioned in face to face relation with the pusher plate 21b through a small gap space. Accordingly, upon actuating the drive member 21a of the pusher means 21, the pusher plate 21b is lifted up to push the roller 18 upward, causing the levers 15 to turn about the shaft 16 to retract the stopper members 13 into receded positions beneath the bottom surfaces of the slide channels 11 for releasing IC devices.

In addition to the above-described stopper members 12 and 13, a couple of clampers 22a and 22b are provided in each slide channel 11 for holding IC devices Da and Db in a stabilized state in cooperation with the stoppers 12 and 13, respectively. The clampers 22a and 22b are either protruded into the slide channel 11 through a slot 14 to assume a clamping position or retracted beneath the slide channel 11 to assume a releasing position. The clampers 22a and 22b are switched to and from the clamping and retracted positions by a mechanism which is arranged substantially in the same manner as the above-described mechanism for switching the stopper member 13 between the blocking and retracted positions.

More specifically, the clampers 22a and 22b are provided on levers 23a and 23b, respectively, which are rockably supported on shafts 24a and 24b (of which the shaft 24b is commonly used for the shaft 16) and which are urged into clamping positions under the influence of biasing force of springs 25a and 25b. The levers 23a as well as the levers 23b of the two slide channels are linked by a connecting shaft 26a or 26b which is bridged therebetween and which is provided with a roller 27a or 27b. The clampers 22a and 22b are released upon pushing up the rollers 27a and 27b. In doing so, the clampers 22a and 22b are released simultaneously by a pusher means 28 which likewise includes a drive member 28a and a pusher plate 28b. Similarly to the pusher means 21 for the stopper members 13, this pusher means 28 is located in such a position as to come into contact or into face to face relation with the rollers 27a and 27b when the loading transfer block 10 is turned into a tilted position.

The loading transfer block 10 is pivotally connected at its fore end to a horizontally reciprocating slide member 30 through a pivoting shaft 31. Therefore, the loading transfer block 10 can be vertically rockable relative to the slide member 30. On the other hand, the slide member 30 is movable back and forth along a slide guide 32, and, for this purpose, it is connected to a piston-cylinder 33 which is employed as a reciprocating drive member.

Figure 12:
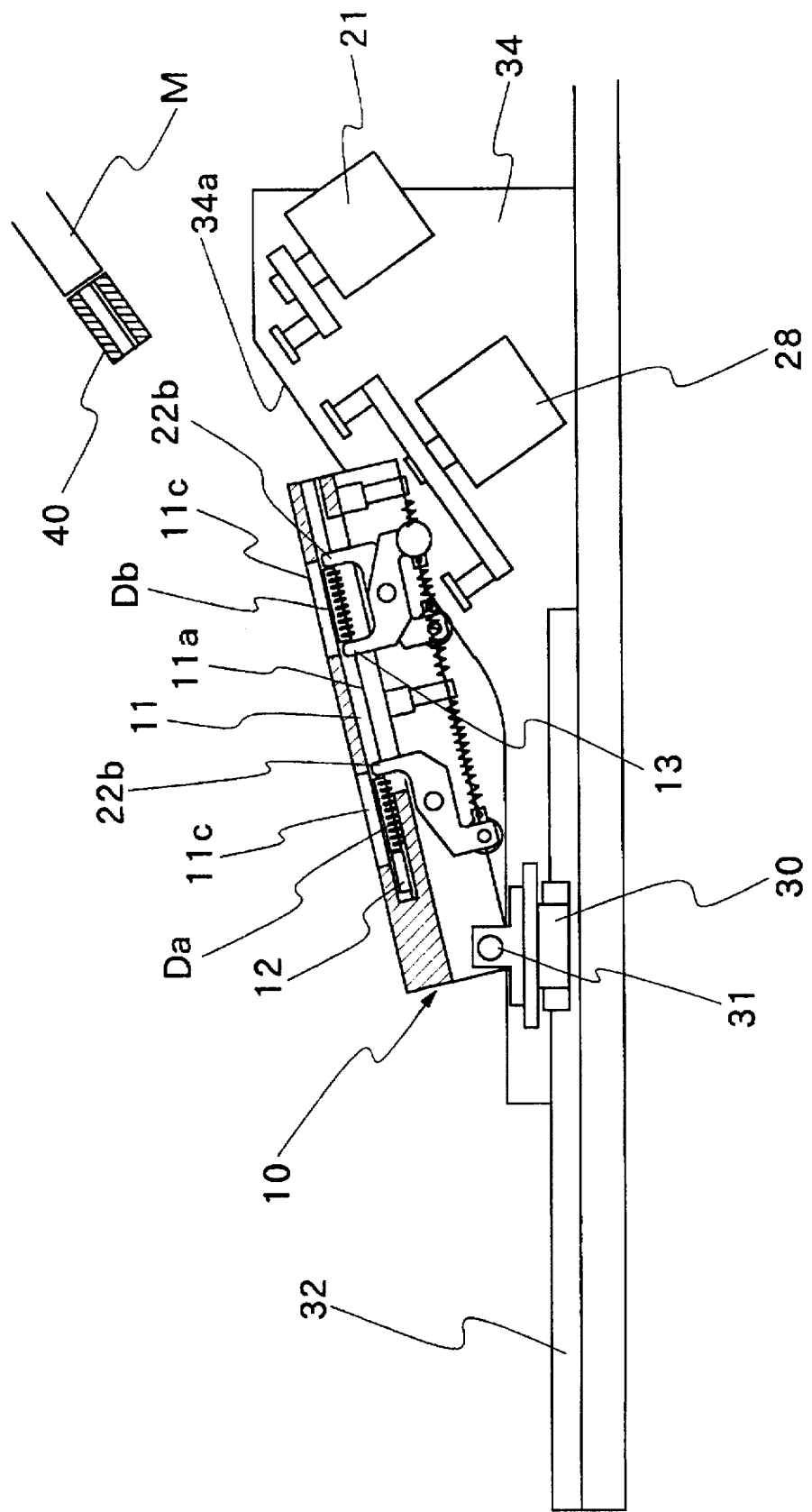
FIG. 12 is a schematic view of the IC package transfer mechanism in operation for shifting the loading transfer block into a horizontal position.

As the slide member 30 is put in reciprocating movement, the rear end of the loading transfer block 10 is turned up and down through a cam mechanism. More specifically, a cam member 34 which is positioned parallel with the slide guide 32 is provided with a cam surface 34a which is sloped downward from an upper terminal end on the side of a magazine M toward a lower terminal end on the side of a flat tray T. Provided on the side of the loading transfer block 10 is a cam follower roller 35 which runs up and down along the sloped cam surface 34a. The cam surface 34 is profiled such that, on a rearward stroke of the cylinder 33 moving the slider member 30 toward the magazine M, the cam follower roller 35 climbs up the sloped cam surface 34a to turn the loading transfer block 10 into a tilted position with the slide channels 11 connected contiguously to an IC outlet at the lower end of a tilted magazine M with the same angle inclination as the latter as shown in FIG. 5, and, on a forward stroke of the cylinder 30 moving the slide member 30 toward the tray T, the cam follower roller 35 climbs down the sloped cam surface 34a to bring the slide channels 11 of the loading transfer block 10 into a horizontal state side by side with a flat tester tray T in a standby position (FIG. 12).

The above-described stoppers 13 and clampers 22a and 22b are normally protruded into blocking or clamping positions within the slide channels 11, and shifted into retracted releasing positions when the loading transfer block 10 is turned into the tilted position. Accordingly, the pusher means 21 and 28 are fixedly mounted on a lateral side of the cam member 34.

For receiving IC devices D from the magazine M, the IC loading transfer block 10 is turned up into the tilted position on the sloped cam surface 34a. Since the loading transfer block 10 can accommodate a couple of IC devices D in each of the slide channels 11 as described above, a couple of IC magazines M are simultaneously set in tilted positions to hand over a couple of ID devices one by one to each of the slide channels 11 through a singular separator which is interposed between the tilted magazines M and the loading transfer block 10.

Figure 8:
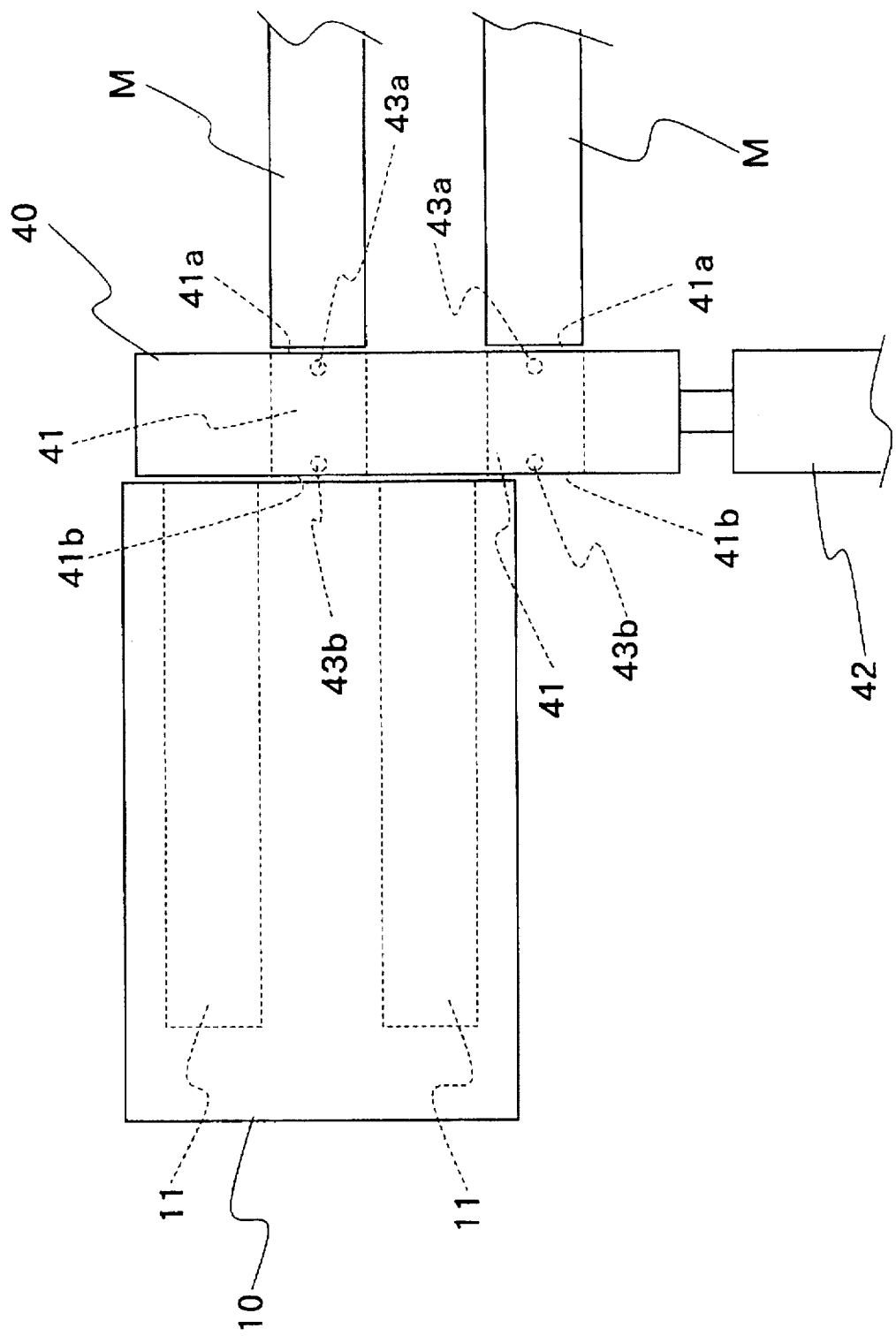
FIG. 8 is a schematic view of a singular package separator mechanism.

As shown in FIG. 8, the singular separator has a main body 40 in the form of a short rectangular block with a couple of open-ended IC passages 41 bored throughout its length, which is dimensioned to accommodate only a single IC package D in each one of the passages 41 each time through entrance openings 41a located contiguously to outlet ends of the tilted magazines M. This singular separator functions to single out a foremost one of IC devices which tend to slide out of each magazine M by gravity, feeding IC devices D one by one to the slide channels 11 on the loading transfer block 10. For this purpose, the main body block 40 is connected to a reciprocating drive member 42 like a piston-cylinder, which shuttles the separator block 40 back and forth in a direction transverse of sliding paths of IC devices D from the magazines M. When the entrance openings 41a of the IC passages 41 on the main body 10 are positioned in alignment with outlet ends of the tilted magazines M, a single IC device D is allowed to slide into each one of the IC passages 41. From this IC receiving position, the separator block 40 is then moved transversely of the sliding paths of IC devices D by the reciprocating drive member 42 to separate the IC devices D in the passages 41 from other devices D in the magazines M. Thus, in this transversely shifted position, that is to say, in the separating position, the foremost one of IC devices D in each magazine M is singled out from the remainder.

By the shift to the separating position, open exit ends 41b of the IC passages 41 on the separator block 40 are now positioned in alignment with entrances 11b of the slide channels 11 on the loading transfer block 10 which is held in the tilted position by the cam mechanism. Accordingly, upon reaching the separating position, the singled-out IC devices D in the passages 41 on the separator block 40 are allowed to slide into the slide channels 11 on the loading transfer block 10. Consequently, by one shuttle movement of the separator block 40, a couple of IC devices D are transferred from the magazines M to the loading transfer block 10.

Sensors 43a and 43b are provided at the respective entrance and exit ends 41a and 41b of the IC passages 41 of the separator block 40 to detect passages of IC devices D. Upon detection of passages of IC devices D by the entrance sensors 43a, a drive signal is fed to the reciprocating drive member 42 to shift the position of the separator block 40. On the other hand, in response to detection signals from the exit sensors 43b, the pusher means 21 and 28, cylinder 33 and reciprocating drive member 42 are controlled to perform the operations as described hereinbefore.

As soon as an IC device D is transferred to each one of the two slide channels 11, the loading transfer block 10 is moved toward the tray T, descending the sloped cam surface 34a to take a horizontal posture. Located over a stop position of the loading transfer block 10 is a handling means (FIG. 13) with four suction heads 50, which are movable toward and away from the loading transfer block 10 to pick up IC devices D on the transfer block 10 by vacuum grips on their molded package casings and transfer them to the tray T. In order for the handling means 51 to have an access to the IC devices D in the slide channels 11, openings 11c are bored in the top wall of the loading transfer block 10 immediately above the slide channel portions where the IC devices D are retained by the stoppers members 12 and 13. Of course, the openings 11c are formed in such dimensions as will permit unobstructed passage of IC devices D therethrough.

In this instance, the IC devices D in the two slide channels 11 of the loading transfer block 10 are located in four separate positions in the same spaced relations as four adjacent IC holder nests on the tray T.

The IC devices D separated from the magazines M are transferred to and relocated on a tray T of the tester machine by the loading transfer block 10 in the manner as described below with reference to FIGS. 9 through 13.

A pair of magazines M which holds IC devices D in a row within the respective cylindrical housings are set in a tilted position, inclining toward the entrances of IC passages of the singular separator to feed IC devices to each of two rows of slide channels 11 on the loading transfer block 10 at the loading terminal of the tester machine. At this time, the main shuttle block 40 of the singular separator is located in the singling-out position where its IC passages 41 are located contiguously in alignment with the outlet ends of the magazines M, while the loading transfer block 10 is retained in the tilted position on the sloped cam surface 34a. In this phase of operation, the entrance openings 11b of the slide channels 11 on the loading transfer block 10 are blocked by the wall of the separator shuttle block 40.

Figure 9:
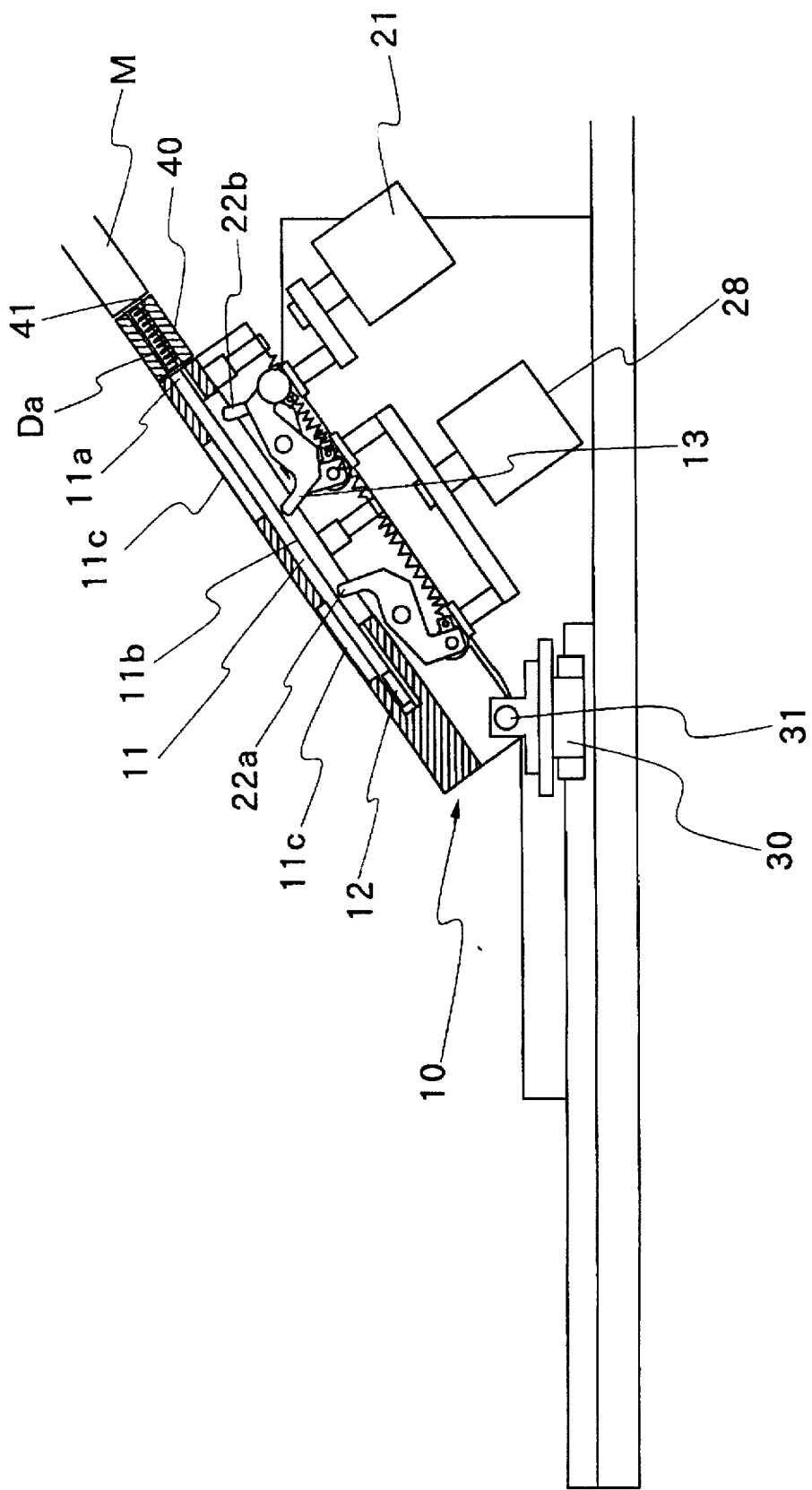
FIG. 9 is a schematic illustration explanatory of an operation by the IC package transfer mechanism in a tilted position with stoppers and clampers in released positions.

In this state, as shown in FIG. 9, firstly the pusher means 21 and 28 are actuated to turn the stopper members 13 into receded positions and the clampers 22a and 22b into the respective released positions. Then, a single IC device Da is fed into each one of the IC passages 41 on the separator shuttle block 40 of the singular separator from the magazines M. As soon as passages of IC devices Da are detected by the sensors 43a on the separator shuttle block 40, the reciprocating drive member 42 is actuated to shift the position of the separator shuttle block 40 in a direction perpendicular to the axes of the magazines M. As a consequence, the IC devices Da in the passages 41 of the separator block 40 are separated in an isolated state. By this shift of the separator block 40 to the isolating position, the exit openings 41b of the IC passages 41 are connected to the slide channels 11 on the loading transfer block 10, while the entrance openings 41a are moved away from the outlet ends of the magazines M. Besides, in this position, the outlet ends of the magazines M are blocked by the wall of the separator shuttle block 40.

Figure 10:
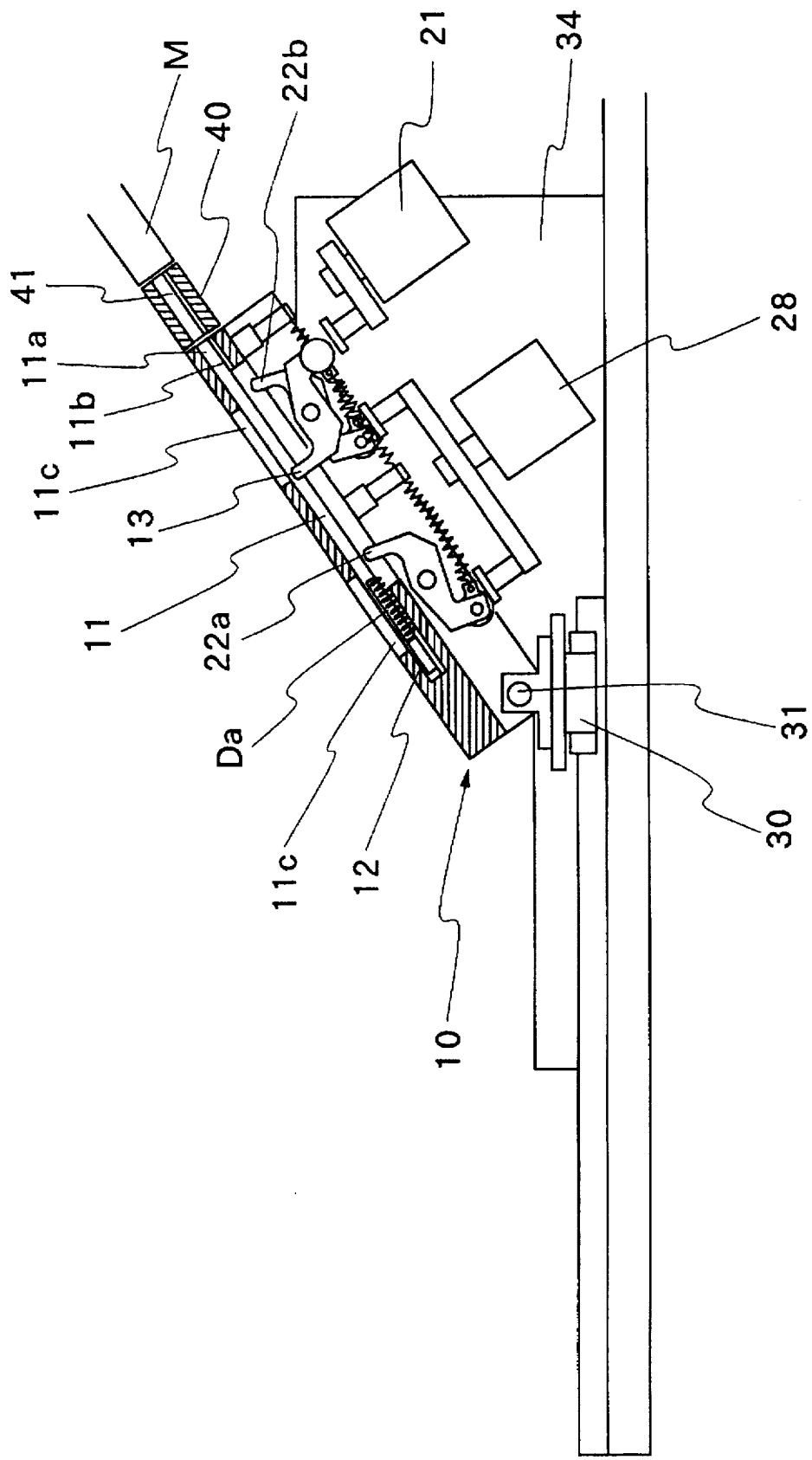
FIG. 10 is a view similar to FIG. 9 but showing the IC package transfer mechanism in an operational phase in which a leading IC package has just been transferred onto a loading transfer block.

Consequently, the isolated IC devices Da in the IC passages 11 are allowed to slide into the slide channels 11 of the loading transfer block 10 by gravity, and the passages of these IC devices are detected by the sensors 43b. The IC devices Da are stopped in predetermined fore stop positions in the slide channels 11 by abutment against the stoppers 13 as shown in FIG. 10. Thereafter, the main block 40 of the singular separator is moved back into the receiving position to connect the IC passages 41 the outlet ends of the magazines M again. In the meantime, the pusher means 21 is actuated to turn the stoppers 13 into the blocking positions. After this, the separator shuttle block 40 is moved to the isolating position to separate and supply IC devices Db to the slide channels 11 of the loading transfer block 10. These secondly isolated IC devices Db can proceed only to predetermined rear stop positions in the slide channels 11 by restraining actions of the stoppers 13.

Figure 11:
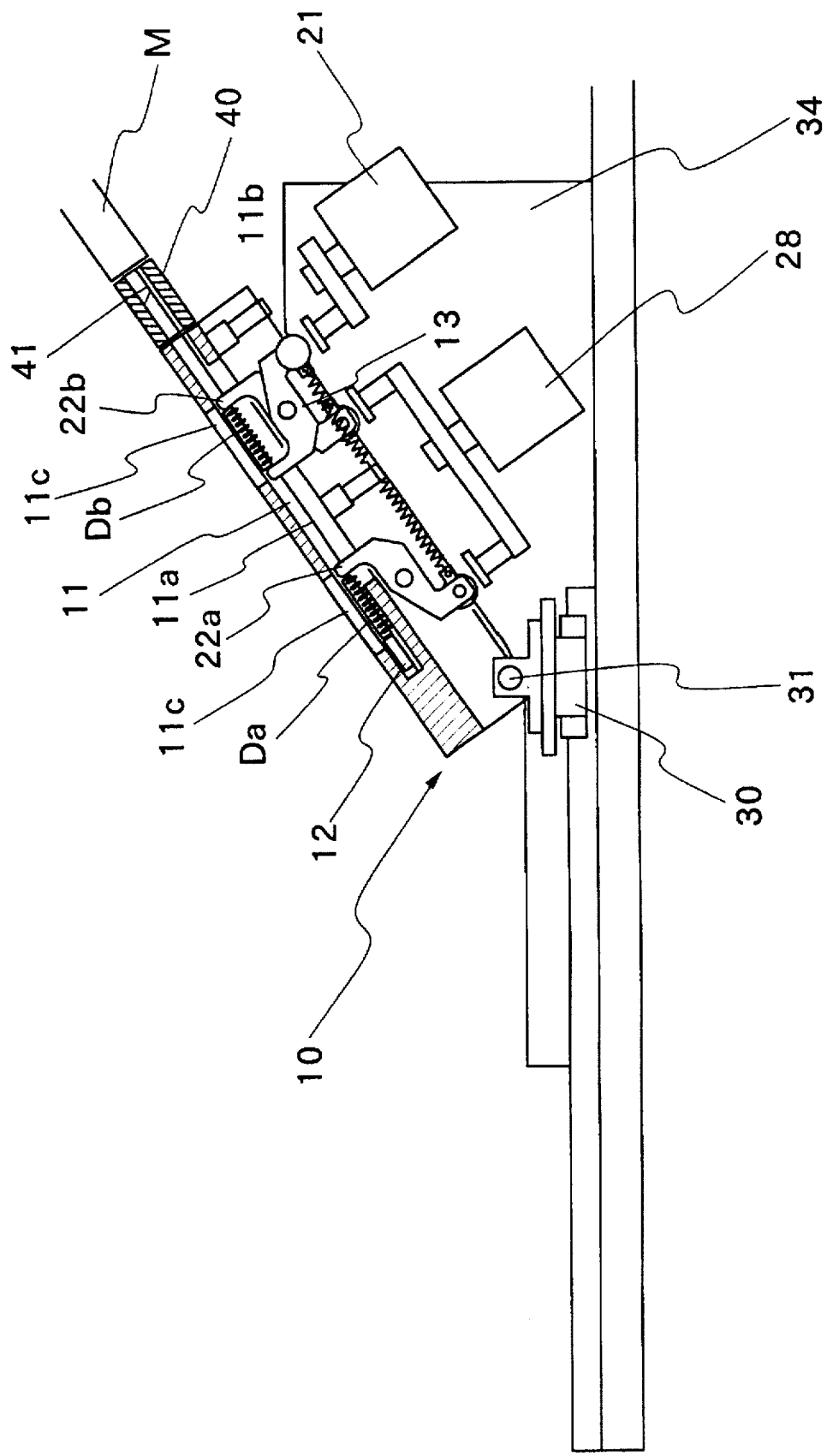
FIG. 11 is a view similar to FIG. 9 but showing the IC package transfer mechanism in an operational phase in which a second IC package has just been transferred onto the loading transfer block.

By these operations, a couple of IC devices Da and Db are separated one after another from each magazine M and fed to the loading transfer block 10, completing transfer of four IC devices in total. Upon detection of passages of the IC devices Da and Db by the sensors 43a and 43b, the clampers 22a and 22b are protruded into the respective slide channels 11 to hold the four IC devices Da and Db in the predetermined stop position in a stabilized state in cooperation with the stoppers members as shown in FIG. 11. However, desirably the clamping forces acting on the respective IC devices D are weakened to some extent so that they can be easily picked up by the suction gripper later on after lifting down the loading transfer block 10 into a horizontal position.

Now, the cylinder 33 is actuated to move the slide member 30, which is connected to the loading transfer block 10, toward the tray T along the slide guide 32. In the meantime, the singular separator is retained in the above-described isolating position until a time point when a next cycle of separation operation is started.

Figure 13:
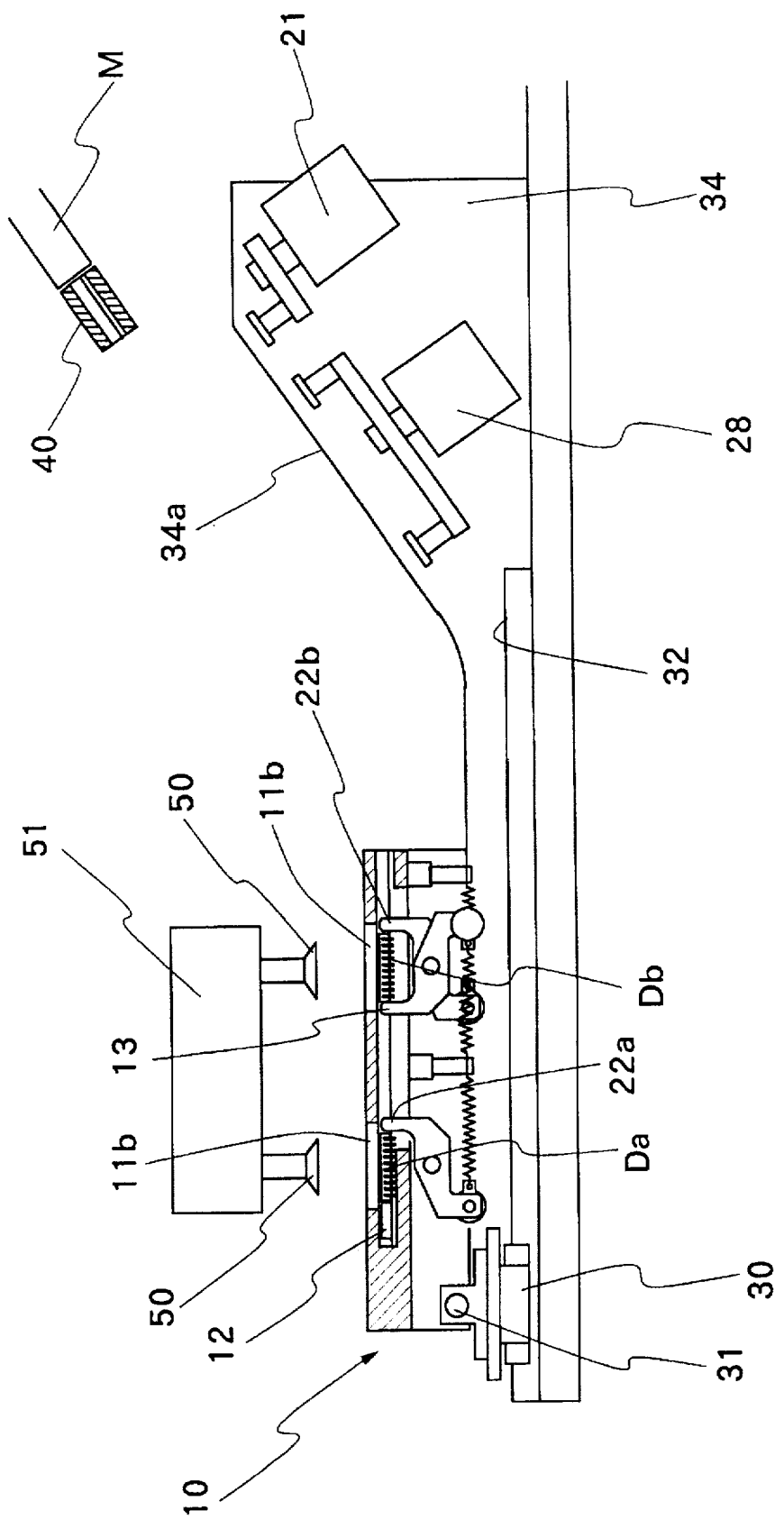
FIG. 13 is a schematic view of the IC package transfer mechanism in operation for transferring IC packages from the loading transfer block onto a flat tester tray.

By the above-described operations, the cam follower roller 35 which is connected to the loading transfer block 10 is caused to run down along the sloped cam surface 34 of the cam member 34, gradually minimizing the angle of inclination of the loading transfer block 10 as shown in FIG. 12 toward the stroke end of the cylinder 33 where the loading transfer block 10 is stopped in horizontal state. Then, as shown in FIG. 13, the handling means 51 is put in operation for lowering the suction heads 50 and picking up the IC devices D through the openings 11c by vacuum grips on molded package casings of the respective IC devices D, followed by uplifting and relocation of the handling means 51 over the tray T. The handling means 51 is then lowered to place the IC devices D in the IC holder nests TR on the tray T by releasing the vacuum grips of the suction heads 50.

By these operations, four IC devices are successively separated from the remainders in the magazines M and simultaneously transferred onto the tray T in each cycle of transfer operation of the loading transfer block 10. Accordingly, by repeating this transfer operation, IC devices D in the tubular magazines M are automatically transferred and relocated on the flat tray T one after another. As soon as the tray T is fully loaded with IC devices D, it is set in a predetermined testing position on an IC tester to make necessary measurements for testing their electrical properties or characteristics. As soon as the tray T leaves for the testing position, a fresh tray T is brought in to the loading position to transfer IC devices D thereto, while emptied magazines M are replaced by fresh magazines M, making it possible to conduct tests on IC devices D in tubular magazines M continuously without depending on manual labors.

Thus, with the above-described IC package transfer mechanism according to the invention, molded IC device packages can be transferred and relocated to and from a tubular IC magazine or magazines and a flat tray by completely automated operations.

What is claimed is:

1. An IC package transfer mechanism for transferring molded IC device packages to and from a flat tray with a large number of IC holder nests in an array on an upper side thereof and an IC magazine adapted to accommodate a large number of the IC packages in a row within a tubular housing to be turned into a tilted position in loading and unloading operations to let the IC packages slide into or out of the cylindrical housing automatically by gravity, said IC package transfer mechanism comprising:

an IC package transfer block movably supported for displacement between a horizontal position and a tilted position, and internally provided with a slide channel with stopper means for holding one or a plural number of the IC packages in predetermined IC stop positions, said slide channel having an open entrance at an end to be turned into said tilted position and connected to an outlet end of a tubular IC magazine set in a similarly tilted position at a loading terminal for transferring the IC packages to said IC transfer block automatically by gravitational sliding movements of individual IC packages, along with top openings bored in a top wall over said IC stop positions to permit access to the IC packages in said slide channel from above by a handling means when said transfer block is in said horizontal position.

2. An IC package transfer mechanism as defined in claim 1, wherein said IC transfer block is pivotally connected at one end to a reciprocating slide member and thereby displaced between a horizontal position and the tilted position through a cam member connected to the other end of said IC transfer block for tilting same in relation with back and forth movements of said slide member.

3. An IC package transfer mechanism as defined in claim 1, wherein said slide channel of said IC transfer block is adapted to hold a plural number of the IC packages in a plural number of the stop positions along the length thereof, and provided with the stopper means at the respective stop positions, said stopper means being retractably protruded into blocking positions in said slide channels except for a fixed stopper means provided in a deepest stop position remote from said entrance end; and said top openings being bored over the respective IC stop positions of said slide channel.

4. An IC package transfer mechanism as defined in claim 3, wherein said top openings or said IC stop positions of said slide channel are arranged in the same positional relations as said IC holder nests on said tray.

5. An IC package transfer mechanism as defined claim 3, wherein said slide channel of said IC transfer block is provided with retractable clamper members at the respective IC stop positions for securely gripping the IC packages in said IC stop positions in cooperation with said stopper members.

6. An IC package transfer mechanism as defined in claim 3, further comprising a singular IC package separator located transversely movably between said magazine and said IC transfer block for singling out and feeding a single IC package from said magazine to said slide channel of said IC transfer block by one transverse shuttle movement across said outlet end of said magazine.

7. An IC package transfer mechanism as defined in claim 6, wherein said singular IC package separator is constituted by a shuttle block arranged to be moved back and forth transversely of said outlet end of said magazine and internally provided with an IC passage so dimensioned as to receive and accommodate only a single IC package at one time.

* * * * *